United States Patent [19]

Hoffman et al.

[11] Patent Number: 5,239,131
[45] Date of Patent: Aug. 24, 1993

[54] ELECTRONIC PACKAGE HAVING CONTROLLED EPOXY FLOW

[75] Inventors: Paul R. Hoffman, Modesto; Linda E. Strauman, Oakdale; Dexin Liang, Modesto; Sonny S. Pareno, Stockton; German J. Ramirez, Antioch, all of Calif.

[73] Assignee: Olin Corporation, New Haven, Conn.

[21] Appl. No.: 912,456

[22] Filed: Jul. 13, 1992

[51] Int. Cl.5 ............................................. H01L 23/02
[52] U.S. Cl. ..................................... 174/52.4; 257/687
[58] Field of Search ..................... 174/52.1, 52.2, 52.3, 174/52.4; 359/74; 257/687, 690, 693, 694, 704; 361/392

[56] References Cited

U.S. PATENT DOCUMENTS

| | | |
|---|---|---|
| 4,105,861 | 8/1978 | Hascoe . |
| 4,451,540 | 5/1984 | Baird et al. ................ 174/52.4 |
| 4,461,924 | 7/1984 | Butt . |
| 4,480,262 | 10/1984 | Butt . |
| 4,594,770 | 6/1986 | Butt . |
| 4,888,449 | 12/1989 | Crane et al. . |
| 4,897,508 | 1/1990 | Mahulikar et al. . |
| 4,939,316 | 7/1990 | Mahulikar et al. . |
| 5,013,871 | 5/1991 | Mahulikar et al. . |
| 5,025,114 | 6/1991 | Braden . |
| 5,066,368 | 11/1991 | Pasqualoni et al. . |
| 5,073,521 | 12/1991 | Braden . |

Primary Examiner—Leo P. Picard
Assistant Examiner—Bot Ledynh
Attorney, Agent, or Firm—Gregory S. Rosenblatt; Paul Weinstein

[57] ABSTRACT

There is provided an electronic package assembly having a die attach paddle bonded to the package base by a compliant adhesive. A recessed channel formed in the base is partially overlapped by the die attach paddle. During package sealing, excess adhesive accumulates in the recessed channel, eliminating bridging of the adhesive to the leadframe.

20 Claims, 2 Drawing Sheets

ELECTRONIC PACKAGE HAVING CONTROLLED EPOXY FLOW

CROSS REFERENCE TO RELATED APPLICATION

This patent application relates to U.S. patent application Ser. No. 07/912,535 entitled "Electronic Package With Stress Relief Channel" by Brian E. O'Donnelly et al, filed on even date and assigned to a common assignee.

BACKGROUND OF THE INVENTION

This invention relates generally to an electronic package having controlled epoxy flow. More particularly, a recessed channel between the die attach paddle and leadframe prevents epoxy from bridging to the leadframe.

DESCRIPTION OF RELATED ART

Adhesively sealed metal packages are disclosed in U.S. Pat. Nos. 4,105,861 to Hascoe; 4,461,924 to Butt and 4,939,316 to Mahulikar et al. The packages have a metallic base and cover. A leadframe is disposed between the base and cover and adhesively bonded to both. The leadframe may have a centrally positioned die attach paddle with an electronic device, such as a silicon based semiconductor integrated circuit, bonded thereto. Small bond wires electrically interconnect the device to inner lead tips of the leadframe.

Assembly of a metal package is described in U.S. Pat. No. 4,897,508 to Mahulikar et al. One method includes:

1. Providing a leadframe having a plurality of leads with inner and outer lead ends. The inner lead ends define a centrally positioned aperture. Spaced within this aperture is a die attach paddle. An integrated circuit device is bonded to the paddle by a low temperature solder, conductive adhesive or conductive glass.

2. The semiconductor device is then electrically interconnected to the leadframe by small diameter, about 0.25 millimeter, gold, aluminum or copper bond wires extending from input/output pads on the face of the device to the inner lead tips.

3. The leadframe assembly comprising the leadframe, die attach paddle and electrically interconnected device is then adhesively bonded to the metal base.

4. A cover is bonded to the opposite side the leadframe encapsulating the inner leads and device.

Care must be taken during assembly operations to insure that the adhesive bonding the die attach paddle to the base has minimal flow. To maximize the size of a semiconductor device which may be packaged in a package, the spacing between the die attach paddle and the inner lead tips is small, on the order of about 0.5–3 mm. Excessive adhesive flow bridges the spacing contacting the inner lead tips. If wire bonding is completed prior to bonding of the paddle, bridging can break the thin bond wires. If wire bonding is delayed until after paddle attach, the bridged adhesive will interfere with wire bonding. In either case, the excessive flow of adhesive leads to a defective package.

Attempts to control the adhesive flow have concentrated on process variables to minimize flow such as controlling cure time, temperature and pressure. Alternatively, the thickness and composition of the adhesive were specified to tight tolerances to control the volume of adhesive. Since all these variables are interrelated, for instance, at higher temperatures the viscosity of the epoxy is reduced, the tighter tolerances led to increased costs and reduced processing rates without a significant increase in yield.

SUMMARY OF THE INVENTION

Accordingly, it is an object of the invention to provide a means to control the flow of adhesive that does not require exacting controls on assembly conditions and adhesive volume. To meet this objective, it is a feature of the invention that a recessed channel is formed in the package base both to direct the flow of the adhesive and to hold excess adhesive in a reservoir. Yet another feature of the invention is that this recessed channel may be either machined or stamped into the package base and is positioned to extend from beneath the die attach paddle almost to the inner lead tips.

The advantage of the recessed channel of the invention is that since excess adhesive is controlled, the assembly parameters and adhesive specifications may be less rigorous leading to increased through-put and reduced cost. The problem of adhesive bridging to the inner lead tips is minimized, thereby improving package assembly yield. The recessed channel provides a thicker adhesive layer around the edges of the die attach paddle reducing stresses induced on the device during assembly operations.

The above stated objects, features and advantages will become more clear from the specification and drawings which follow.

DESCRIPTION OF THE INVENTION

Figure 1:
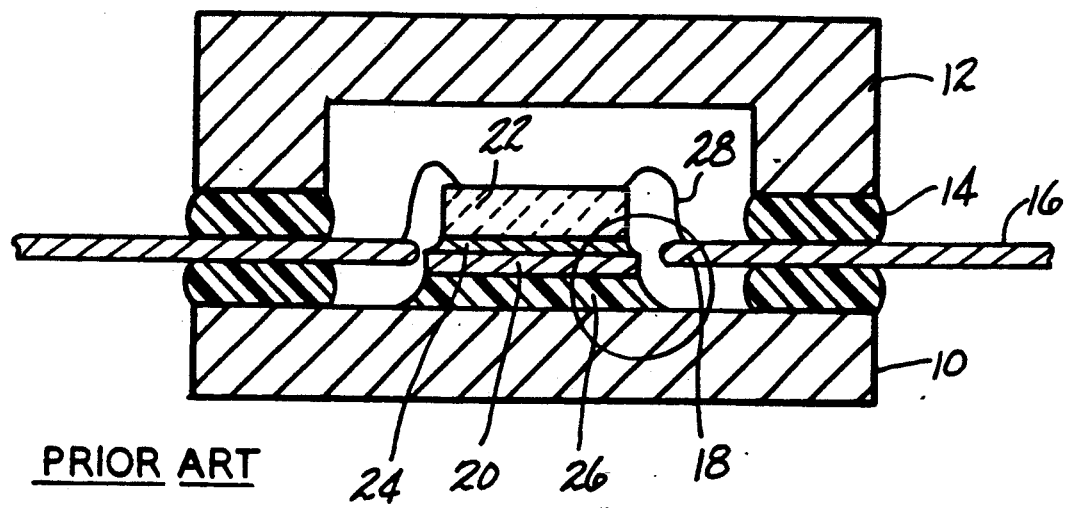
FIG. 1 shows in cross-sectional representation an adhesively sealed metal package as known from the prior art.

FIG. 1 shows in cross-sectional representation an adhesively sealed metal package as known from the prior art. The package has a metallic base 10 and a cover 12. The cover 12 is usually, but not necessarily, also metal and preferably has a coefficient of thermal expansion approximately equal to that of the base 10. A first polymer adhesive 14 bonds the base 10 to the cover 12. A leadframe 16 is disposed between the base 10 and cover 12 and adhesively bonded to both. Inner lead ends 18 of the leadframe 16 define a ceñtral region. Located within this central region is a die attach paddle 20. An integrated circuit device 22 is bonded to the die attach paddle 20 by a die attach material 24 such as a low melting solder, conductive adhesive or conductive glass. The conductive adhesives and glasses typically are a silver-filled polymer or silver-filled glass. The die attach paddle 20 is bonded to the base 10 by a second adhesive 26. Bond wires 28 electrically interconnect inner lead ends 18 to input/output pads on the integrated circuit device 22.

Figure 2:
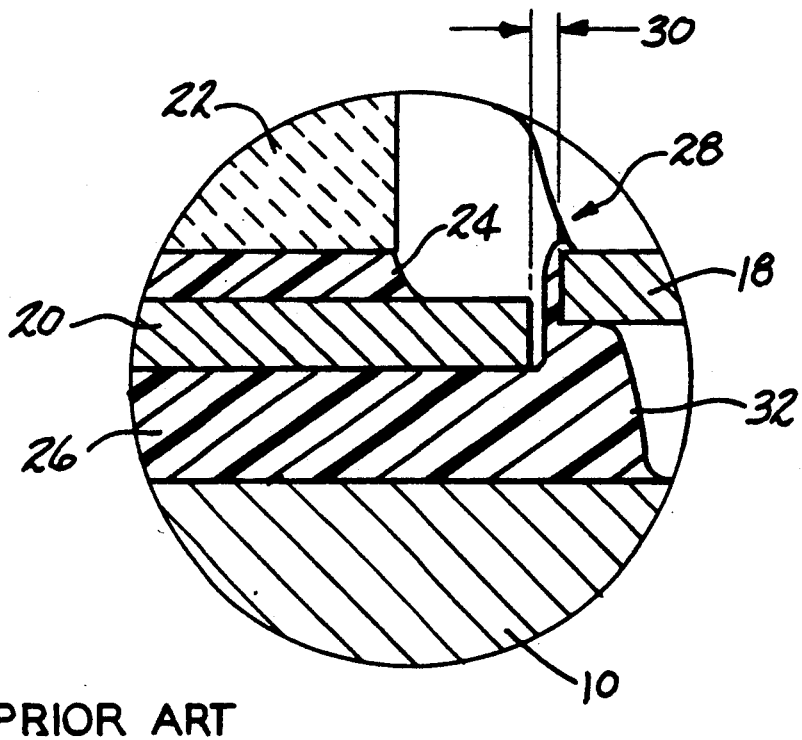
FIG. 2 is an exploded view of the die attach paddle/lead tip interface of the package of FIG. 1 illustrating bridging.

FIG. 2 is an exploded view of the circled region of FIG. 1 illustrating excessive flow causing the second adhesive 26 to bridge to the inner lead tips 18 of the leadframe. The spacing 30 between the inner lead tips 18 and die attach paddle 20 is small, typically on the order of 0.5-3 millimeters. The excess epoxy 32 flows through the space 30 bridging to inner lead tips 18. The bridged epoxy can interfere with the bond wires 28.

Figure 3:
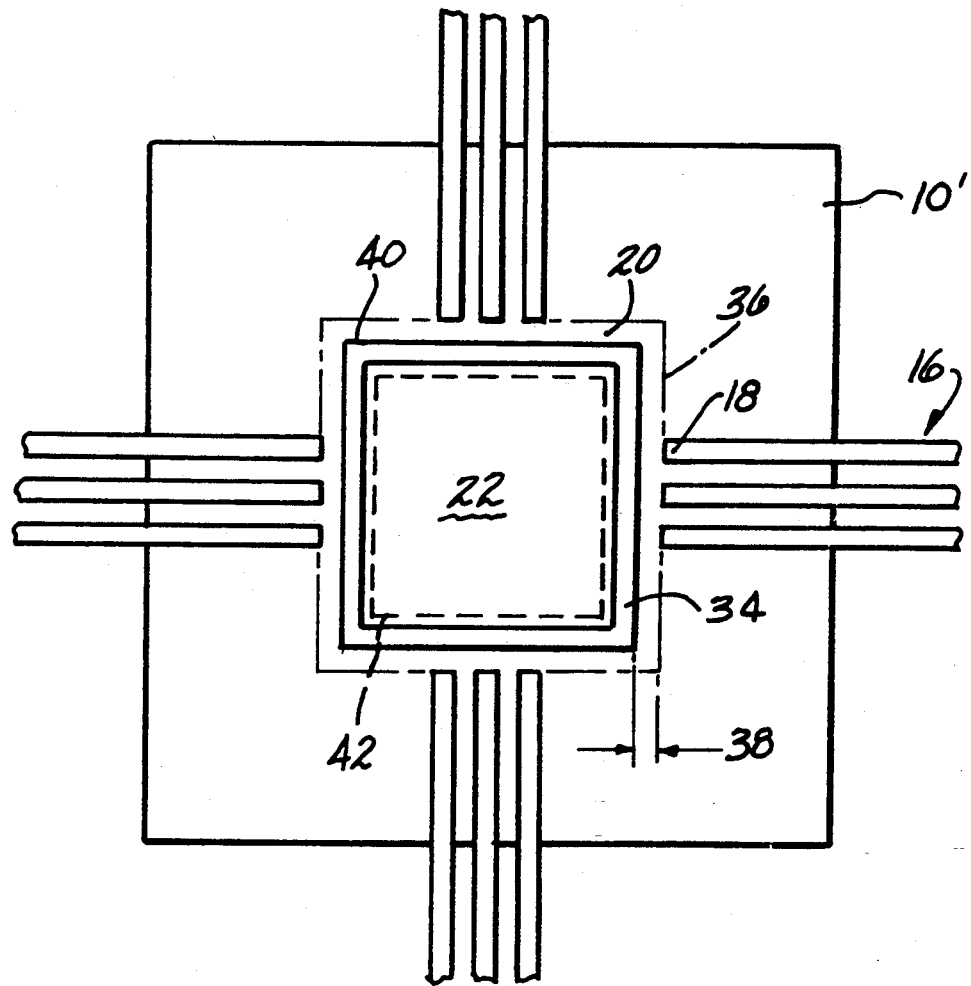
FIG. 3 shows in top planar view a leadframe and die attach paddle adhesively sealed to a package base containing the recessed channel of the invention.

Bridging is prevented when the base 10' includes a recessed channel 34 in accordance with the invention and illustrated in FIG. 3. While the electronic package assembly of FIG. 3 illustrates a quad leadframe 16 with inner lead tips 18 approaching the semiconductor device 22 from four sides, the concepts of the invention are applicable to other package assembly configurations such as dual in line packages and pin grid array packages. The assembly of FIG. 3 shows only 12 leads for clarity, the concepts of the invention are applicable to packages having any number of leads.

The recessed channel 34 is disposed in the central region (identified by dotted phantom line 36) defined by inner lead tips 18. The recessed channel 34 is, preferably, positioned to provide a space 38 between the outside edge 40 of the recessed channel 34 and the inner lead tips 18. The spacing is preferably from about 0.13 millimeters to about 0.40 millimeters (5-15 mils). More preferably, the space is from about 0.20 to about 0.30 millimeters (8-12 mils).

The recessed channel 34 is preferably continuous to fully control the adhesive flow. Rather than a recessed channel, the channel may be raised and take the form of a dam. However, a raised dam is less preferred since the raised area is closer to the bond wires increasing the possibility of an electrical short circuit.

The inside peripheral edge of the recessed channel 34 is shown by dashed phantom line 42 and is preferably overlapped by the die attach paddle 20. While any area percent of the die attach paddle may overlap the recessed channel, the area of overlap has a thicker adhesive layer separating the metallic base 10' from the die attach paddle 20. A thicker adhesive around the perimeter of the die attach paddle 20 is desirable to reduce mechanical stresses induced on the semiconductor device 22 by differences in the coefficient of thermal expansion between the device and the package base. However, the majority of the device 22 cross-sectional area should be separated from the metallic package base 10' by a minimal amount of adhesive to improve the conduction of heat from the device. In preferred configurations, up to about 25 area percent of the die attach paddle overlaps the recessed channel 34. More preferably, the area percent of overlap is from about 10% to about 20%.

Figure 4:
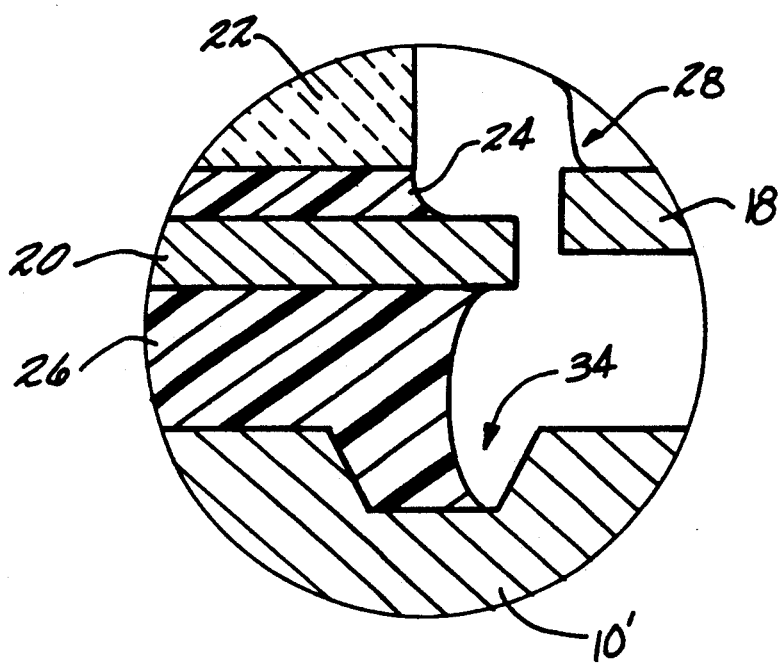
FIG. 4 is an exploded view of the die attach paddle/lead tip interface of the package of the invention illustrating how the recessed channel prevents bridging.

FIG. 4 shows an exploded view of the die attach paddle/inner lead tip interface when a recessed channel 34 is provided in accordance with the invention. The recessed channel 34 is a volumetric reservoir to receive second adhesive 26 preventing bridging to the inner lead tips 18. The depth of the recessed channel 34 is dependent the method of manufacturing the channel. If formed by a metal removal process such as milling or erosive spark machining, depths up to about 1 millimeter (0.040 inches) insure a suitably sized reservoir to accumulate all excess adhesive.

A preferred method of manufacturing is stamping. The process is quicker than metal removing means and does not generate scrap. The depth of a stamped cavity is limited by surface considerations. If the stamped recess is too deep, the surface finish and smoothness on the opposite side of the base is indented. Limiting the stamped recess to a depth of about 0.25 millimeters (0.010 inches), and preferably from about 0.075 millimeters to about 0.175 millimeters (0.003-0.007 inches) avoids indentations.

Another method of forming the recessed channel without indentations is to utilize a controlled metal flow process as disclosed in U.S. Pat. No. 5,244,709 to Rooney. According to the Rooney process, grooves or other shapes are cut into the base in a region remote from the recessed channel. When the recessed channel is stamped into the base, the forming tool constrains metal flow such that excess metal flows into the preformed grooves rather than forming indentations on the base of the package.

While the base and cover may be formed from any suitable material, for enhanced thermal conductivity to remove heat from the integrated circuit device, both the base and cover component are preferably formed from a metallic material such as copper, aluminum or their alloys. Most preferred are aluminum alloys of the 3xxx series containing up to 1.5% by weight manganese along with other alloying additions. As disclosed in the above-cited U.S. Pat. No. 4,939,316 one suitable alloy is aluminum alloy 3003 having a nominal composition of about 0.12% by weight copper, about 1.2% by weight manganese and the balance aluminum.

In accordance with the invention, the base 10' has a recessed channel 34 of a desired width and depth stamped to a depth of about 0.13 mm (0.005 inches). The stamped base is then anodized over at least those surfaces which will be exposed to the external environment after package assembly. Typically, the entire base and cover are completely anodized. To maximize infrared absorption such as conventionally used to heat the package for soldering of the leads to a printed circuit board, both the base and cover component are integrally anodized to a uniform black color. One suitable anodization sequence involves anodically immersing the metallic components in an electrolyte containing an aqueous mixture of sulfuric and sulfosalicyclic acids and spiking the amperage to in excess of about 70 amps within the first 3 minutes of the anodization. This process is described in more detail in U.S. Pat. No. 5,066,368 to Pasqualoni et al.

The first polymer adhesive is then tacked to the perimeter of the base and the cover for subsequent bonding to the leadframe. The second adhesive is tacked to the central region of the base component for bonding the die attach paddle. Preferred first adhesives include a thermosetting epoxy such as Ablestik 550 (Ablestik Laboratories, Gardenia, Calif.) and Hysol XEA9684NM (The Dexter Company, Pittsburg, Calif.). While the first and second adhesives may be the same, the second (pad attach) adhesive is preferably a thermally conductive compliant epoxy such as Ablestik 965-1L or Olin RC-99-1 (Olin Corporation, Stamford, Conn.). "Tacking" is used in its conventional sense in the art meaning bonding without completely curing the epoxy through the use of minimal heat and pressure.

The leadframe-pad attach assembly is then bonded to the base component by a full cure of the epoxy. The integrated circuit device may be attached to the die attach pad and electrically interconnected to the inner lead tips either before or after this step.

A cover component is adhesively sealed to the base with the leadframe disposed therebetween completing the package. Alternatively, a rectangular window frame component may be bonded to the base component with the leadframe disposed therebetween. The cover component is then subsequently bonded to the opposite side of the leadframe.

While the invention has been described most particularly in terms of a metallic base and cover, it is within the scope of the invention for the base and cover components to be formed from any suitable material such as plastic, ceramic, ceramic/glass composites and ceramic/metal composites. While the pad attach material has been most particularly described in terms of a polymer adhesive, any compliant adhesive may be used. For example, a metallic solder could constitute the pad attach adhesive.

The patents set forth in this application are intended to be incorporated herein by reference.

It is apparent that there has been provided in accordance with this invention, an adhesively sealed electronic package which prevents bridging of the pad attach adhesive to the inner lead tips which fully satisfies the objects, means and advantages set forth hereinbefore. While the invention has been described in combination with specific embodiments and examples thereof, it is evident that many alternatives, modifications and variations will be apparent to those skilled in the art in light of the foregoing description. Accordingly, it is intended to embrace all such alternatives, modifications and variations as fall within the spirit and broad scope of the appended claims.

We claim:

1. An electronic package assembly, comprising:
   a leadframe having a plurality of leads, the inner lead ends of which define a central region;
   a die attach paddle located within said central region;
   a base containing a channel; and
   a first polymer adhesive bonding said base to said leadframe and a compliant second polymer adhesive bonding said base to said die attach paddle with said channel disposed within said central region.

2. The electronic package assembly of claim 1 wherein said channel is spaced apart from said inner lead ends.

3. The electronic package assembly of claim 2 wherein the space between said channel and said inner lead ends is from about 0.13 millimeters to about 0.4 millimeters.

4. The electronic package assembly of claim 3 wherein the space between said channel and said inner lead ends is from about 0.20 millimeters to about 0.3 millimeters.

5. An electronic package assembly, comprising:
   a base containing a recessed channel;
   a leadframe having a plurality of leads, the inner lead ends of which define a central region;
   a die attach paddle located within said central region and at least partially overlapping said channel; and
   a first polymer adhesive bonding said base to said leadframe and a compliant second polymer adhesive bonding said base to said die attach paddle.

6. The electronic package assembly of claim 5 wherein up to about 25 area percent of said die attach paddle overlaps said recessed channel.

7. The electronic package assembly of claim 6 wherein from about 10 to about 20 area percent of said die attach paddle overlaps said recessed channel.

8. The electronic package assembly of claim 6 wherein the depth of said recessed channel is up to about 1 millimeter.

9. The electronic package assembly of claim 8 wherein said recessed channel is stamped to a depth of up to about 0.25 millimeters.

10. The electronic package assembly of claim 9 wherein the depth of said recessed channel is from about 0.075 millimeters to about 0.175 millimeters.

11. An adhesively sealed metal electronic package, comprising:
    a leadframe having a plurality of leads, the inner lead ends of which define a central region;
    a die attach paddle located within said central region;
    a metallic base component bonded to said leadframe with a first polymer adhesive and to said die attach paddle with a compliant second polymer adhesive, said base component having a recessed channel disposed in said central region such that the outer perimeter of said recessed channel is spaced from said inner lead ends and the inner perimeter of said recessed channel is overlapped by said die attach paddle; and
    a cover bonded to said metallic base by said first polymer adhesive with said leadframe disposed therebetween.

12. A metal electronic package, comprising:
    a leadframe having a plurality of leads, the inner lead ends of which define a central region;
    a die attach paddle located within said central region;
    an aluminum alloy base component bonded to said leadframe with a first polymer adhesive and to said die attach paddle with a compliant second polymer adhesive, said aluminum alloy base component having a recessed channel disposed in said central region such that the outer perimeter of said recessed channel is spaced from said inner lead ends and the inner perimeter of said recessed channel is overlapped by said die attach paddle; and
    an aluminum alloy cover bonded to said aluminum alloy base by said first polymer adhesive with said leadframe disposed therebetween, wherein both said aluminum alloy base component and said aluminum alloy cover are at least partially coated with an anodization layer.

13. The metal electronic package of claim 12 wherein the depth of said recessed channel is from about 0.075 millimeters to about 0.175 millimeters.

14. The metal electronic package of claim 13 wherein the space between said outer perimeter of said recessed channel and said inner lead ends is from about 0.13 millimeters to about 0.40 millimeters.

15. The metal electronic package of claim 14 wherein the area percent of said die attach paddle overlapping said recessed channel is up to about 25%.

16. The metal electronic package of claim 15 wherein the area percent of said die attach paddle overlapping said recessed channel is from about 10% to about 20%.

17. An adhesively sealed metal electronic package, comprising:
    a leadframe having a plurality of leads, the inner lead ends of which define a central region;
    a die attach paddle located within said central region;
    a metallic base component adhesively bonded to said leadframe and to said die attach paddle with a polymer adhesive, said base component having a recessed channel disposed in said central region such that the outer perimeter of said recessed channel is spaced from said inner lead ends and the inner perimeter of said recessed channel is overlapped by said die attach paddle;

a window frame having first and second sides, said first side bonded to said base with said leadframe disposed therebetween; and a cover bonded to said second side of said window frame.

18. The metal electronic package of claim 17 wherein the depth of said recessed channel is up to about 0.25 millimeters.

19. The metal electronic package of claim 18 wherein the space between said recessed channel and said inner lead ends is from about 0.13 millimeters to about 0.40 millimeters.

20. The metal electronic package of claim 19 wherein the area percent of said die attach paddle overlapping said recessed channel is less than about 25%.

* * * * *